United States Patent
Katsumata et al.

[11] Patent Number: 6,144,263
[45] Date of Patent: Nov. 7, 2000

[54] VOLTAGE-CONTROLLED OSCILLATOR AND METHOD FOR ADJUSTING FREQUENCY SHIFT AMOUNT THEREOF

[75] Inventors: Masashi Katsumata; Takeshi Endo, both of Chiba, Japan

[73] Assignee: TDK Corporation, Tokyo, Japan

[21] Appl. No.: 09/249,134

[22] Filed: Feb. 12, 1999

[30] Foreign Application Priority Data

Feb. 18, 1998 [JP] Japan .................................. 10-036241

[51] Int. Cl.[7] .................................................. H03B 5/18
[52] U.S. Cl. .............. 331/96; 331/107 SL; 331/107 DP; 331/117 D; 333/205; 333/235
[58] Field of Search ................................ 331/96, 107 SL, 331/36 L, 99, 117 D, 107 DP; 333/221, 204, 205, 235

[56] References Cited

U.S. PATENT DOCUMENTS

| | | | |
|---|---|---|---|
| 4,583,064 | 4/1986 | Makimoto et al. | 333/219 |
| 4,639,691 | 1/1987 | Iigima | 331/99 |
| 4,749,963 | 6/1988 | Makimoto et al. | 331/99 |
| 5,852,388 | 12/1998 | Nakai et al. | 331/177 V |

FOREIGN PATENT DOCUMENTS

| | | |
|---|---|---|
| 7-202638 | 8/1995 | Japan . |
| 8-316731 | 11/1996 | Japan . |

OTHER PUBLICATIONS

Patent Abstracts of Japan, vol.016, No. 423 (E–1260), Sep. 7, 1992, JP–A–04 145907, May 19, 1992.
Patent Abstracts of Japan, vol. 016, No. 027, ( E–1158), Jan. 23, 1992, JP–A–03 242007, Oct. 29, 1991.

*Primary Examiner*—Arnold Kinkead
*Attorney, Agent, or Firm*—Oblon, Spivak, McClelland, Maier & Neustadt, P.C.

[57] ABSTRACT

A voltage-controlled oscillator and a method capable of precisely adjusting a frequency shift amount are provided irrespective of a fluctuation in characteristics of elements such as a strip-line. A center tap 19 is formed in a strip-line 16 of a resonator. A switching element 20 is connected to the center tap 19, and this switching element 20 is turned ON, so that the center tap is shortcircuited to the ground so as to vary the oscillating frequency. A slit A1 is conducted in the vicinity of the center tap 19 along the strip-line 16 and directed toward a shortcircuited end 17 of the strip-line, so that a frequency shift amount is adjusted. Also, a slit B1 is conducted in the vicinity of the shortcircuited end 17 along the strip-line 16 and directed toward the center tap 19, so that a frequency shift amount is adjusted. Also, trimming points are provided on the side of a hot terminal 18 from the center tap 19, and also provided on the side of the shortcircuited end 17 from the center tap 19, and further a slit is conducted along an intersecting direction of the strip-line 16, so that a shift amount is adjusted.

16 Claims, 3 Drawing Sheets

— SHIFT SIGNAL ON
--- SHIFT SIGNAL OFF

— SHIFT SIGNAL ON
--- SHIFT SIGNAL OFF

— SHIFT SIGNAL ON
--- SHIFT SIGNAL OFF

VOLTAGE-CONTROLLED OSCILLATOR AND METHOD FOR ADJUSTING FREQUENCY SHIFT AMOUNT THEREOF

FIELD OF THE INVENTION

BACKGROUND OF THE INVENTION

The present invention is related to a voltage-controlled oscillator and a method for adjusting a shift amount of a frequency in a high frequency voltage-controlled oscillator employed in a mobile communication such as a portable telephone.

DISCUSSION OF THE BACKGROUND

A voltage-controlled oscillator is capable of varying an oscillating frequency in response to a change in control voltages. In such a case that two greatly different frequency bands of oscillating frequencies are used in a voltage-controlled oscillator used in a dual type radio communication apparatus, for instance, an oscillating frequency band existed in the vicinity of 800 MHz and another oscillating frequency band existed in the vicinity of 1.5 GHz when such a wide oscillating frequency is covered by a single voltage-controlled oscillator, a changing ratio (df/dVt) of an oscillating frequency "f" to a change in a control voltage Vt must be increased. That is, a so-called "control voltage sensitivity" should be made high. However, when this control voltage sensitivity is increased, such characteristics as a spurious response, a lock-up time (initiating time), and C/N would be deteriorated, which are required as PLL characteristics.

To solve these problems, Unexamined Japanese Patent Publication 8-316731 has proposed the following method. That is, a strip-line is employed in a resonator, a center tap is formed in this strip-line, and such a control is made as to whether or not the center tap is shortcircuited to the ground in response to ON/OFF states of a shift signal. As a result, the oscillator can be operated at the two greatly separated frequency bands.

Also, Unexamined Japanese Patent Publication 7-202638 has proposed such a system that two sets of resonators i.e., (inductors) are provided, and these resonators are switched by using a switch so as to shift the frequency.

However, as in the conventional oscillating method described in Unexamined Japanese Patent Publication 8-316731, in which the frequency band is greatly varied in response to whether or not the center tap of the strip-line is shortcircuited, there are the following problems. That is, since the fluctuations are present in the strip-line, the shift element, and the capacitors, corresponding to the structural elements of the voltage-controlled oscillator, it is practically difficult to vary the frequency shift amount under stable condition. In other words, even when the adjusting trimming electrode is additionally provided with the resonator made of the strip-line and then this trimming electrode is trimmed so as to adjust the oscillating frequency, it is practically difficult to carry out the adjustment of the shift amount at the same time.

Also, as explained in Unexamined Japanese Patent Publication 7-202638, the resonators are switched by operating a switch, so that two sets of operating bands can be obtained. In this conventional system, since two sets of resonators are required, there is another problem that the shapes cannot be made compact.

SUMMARY OF THE INVENTION

The present invention has been made to solve the above-described problems, and therefore, has an object to provide a voltage-controlled oscillator and a method capable of precisely adjusting an amount of a frequency shift in a voltage-controlled oscillator irrespective of a fluctuation in characteristics of elements such as a strip-line.

According to the present invention, a voltage-controlled oscillator comprises a structure that a strip-line is employed as a resonator; a center tap is-provided in the strip-line of the resonator; a switching element is connected to the center tap; and the center tap is electrically shortcircuited to the ground by turning ON the switching element so as to vary an oscillating frequency; a slit is formed along the strip-line located in the vicinity of the center tap and directed to a shortcircuited end side of the strip-line to thereby adjust an amount of a frequency shift.

The shift amount can be decreased in accordance with the length of the slit formed in the strip-line and directed toward the shortcircuited end side thereof in the vicinity of the center tap.

Furthermore, according to the present invention, in a voltage-controlled oscillator, a slit is formed along the strip-line located in the vicinity of a shortcircuited end side of the strip-line and directed to the center tap to thereby adjust an amount of a frequency shift.

The shift amount can be increased in accordance with the length of the slit formed along the strip-line located in the vicinity of the shortcircuited end side of the strip-line and directed toward the center tap.

Moreover, according to the present invention, a trimming point is formed on the side of a hot terminal of the strip-line from the center tap; another trimming point is formed on the side of a shortcircuited end of the strip-line from the center tap; and a slit is formed in at least any one of the trimming points in a direction along which the slit intersects the strip-line.

The shift amount can be decreased in accordance with the length of the slit formed in the direction along which the slit intersects the strip-line at such a trimming point formed on the side of the hot terminal of the strip-line from the center tap. Also, the shift amount can be increased in accordance with the length of the slit formed in the direction along which the slit intersects the strip-line at such a trimming point formed on the side of the shortcircuited end of this strip-line from the center tap.

DETAILED DESCRIPTION OF THE PREFERRED EMBODIMENTS

First Embodiment

Figure 1A:
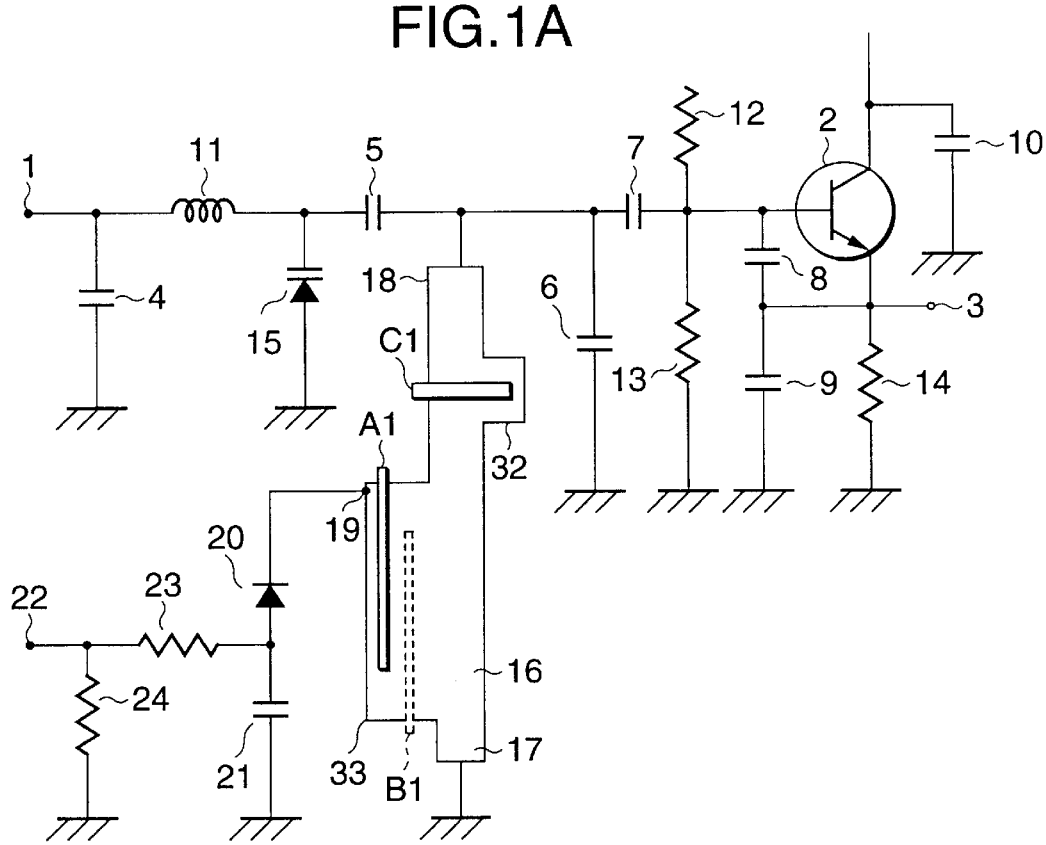
FIG. 1A is a circuit diagram of a voltage-controlled oscillator for showing a frequency shift amount adjusting method of the voltage-controlled oscillator according to an embodiment mode of the present invention.
Figure 1B:
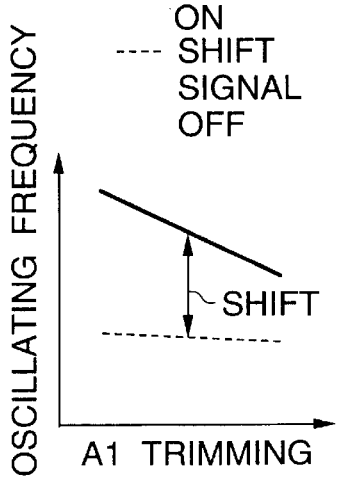
FIGS. 1B to 1D are diagrams for representing a relationship between trimmings, oscillating frequencies, and shift amounts of this voltage-controlled oscillator.
Figure 1C:
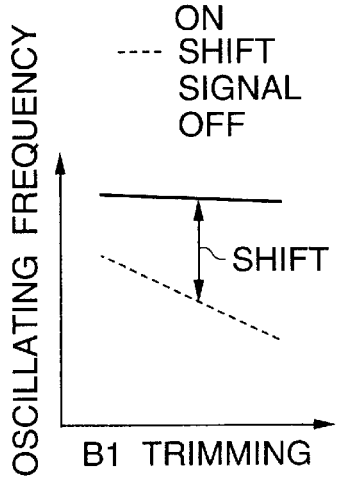
Figure 1D:
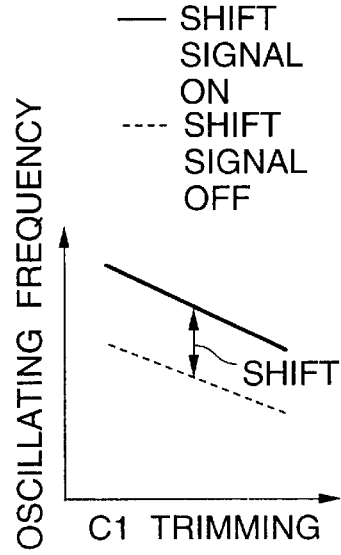
Figure 2A:
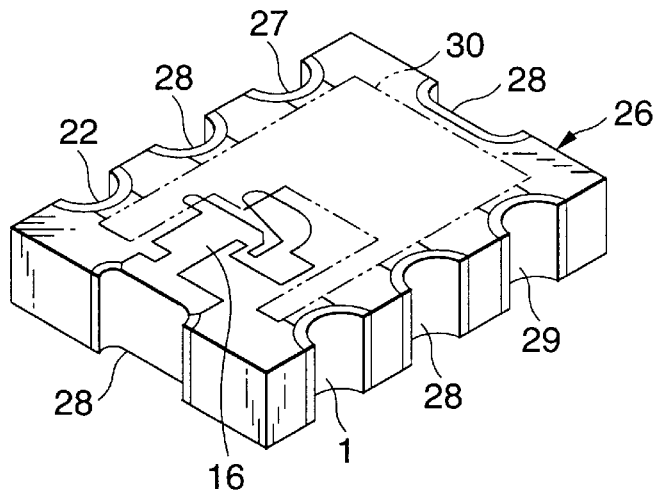
FIG. 2A is a schematic outer view for indicating the voltage-controlled oscillator used to perform the method of FIG. 1A.
Figure 2B:
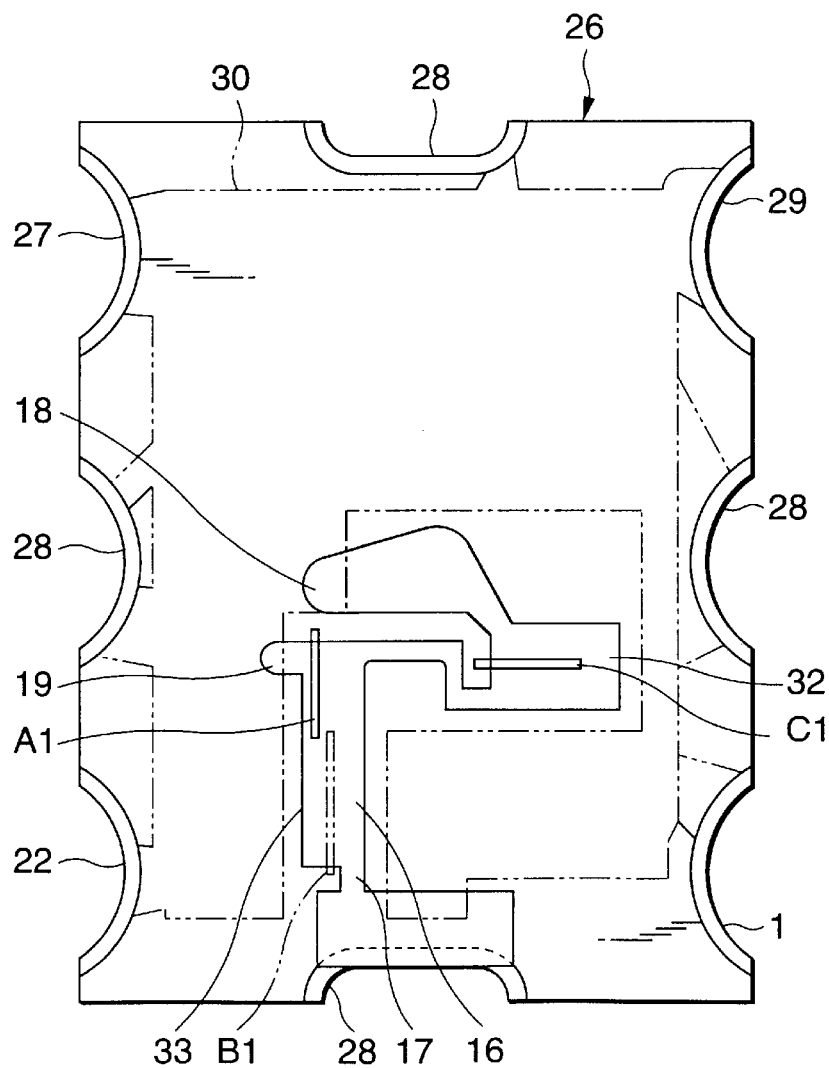
FIG. 2B is a plan view for schematically indicating this voltage-controlled oscillator.

FIG. 1A is a circuit diagram for representing a voltage-controlled oscillator according to an embodiment of the present invention in combination with a trimming method. FIG. 1B to FIG. 1D indicate relationship diagrams among each of trimming amounts and amounts of frequency shifts. FIG. 2A is a perspective view for showing an outer view of the voltage-controlled oscillator according to this embodiment, in which a strip-line is drawn at a center thereof and from which mounted components are omitted. FIG. 2B is a plan view of this voltage-controlled oscillator.

In FIG. 1A, reference numeral 1 shows a control voltage terminal,, and reference numeral 2 indicates an oscillating transistor. A high frequency output is derived from an emitter 3 of this oscillating transistor 2. With respect to the transistor 2, there are provided capacitors 4 to 10, an inductor 11, resistors 12 to 14, a varicap diode 15, and a strip-line 16 functioning as a resonator.

Both the inductor 11 and the capacitor 4 are used to eliminate a high frequency component from a DC voltage applied to the control voltage terminal 1, and then to apply the eliminated DC voltage to the varicap diode 15. The capacitor 5 is employed so as to cut the DC voltage, and the capacitor 6 is employed so as to adjust a frequency. Also, the capacitor 7 is employed in order that a resonant circuit constructed of the varicap diode 15, the capacitors 5, 6 and the strip-line 16 is coupled to the above-described transistor 2 and a peripheral circuit thereof.

In the strip-line 16, reference numeral 17 indicates a shortcircuited end connected to the ground; reference numeral 18 shows a hot terminal connected between the capacitor 5 and the capacitor 6, and reference numeral 19 indicates a center tap formed between the hot terminal 18 and the shortcircuited end 17. A diode 20 functioning as a switching element is connected in series to a capacitor 21. This series circuit is interposed between the center tap 19 and the ground. A shift signal input terminal 22 is connected via a resistor 23 to these connection points. A resistor 24 is such a resistor capable of discharging the capacitor 21.

As indicated in FIGS. 2A and 2B, a voltage-controlled oscillator 26 is made of a glass epoxy board, or another board. This board is manufactured with ceramics having a low dielectric constant, the board is stacked by either the screen printing method or the sheet stacking layer method, and other conductors such as copper, nickel, and silver are stacked and sintered. The above-explained control voltage terminal 1, a shift signal input terminal 22, an output terminal 27, a ground terminal 28, and a power supply terminal 29 are provided around this board.

In such a case that a board is made of a stacked board, the circuit elements other than those formed in this stacked board are mounted on a portion surrounded by a two-dot/dash line 30, and are mutually connected to each other by a conductor pattern. These circuit elements are the above-described capacitors 4 to 10, and 21, inductor 11, and also resistors 11 to 14, 23, 24 in addition to the varicap diode 15 and the diode 20, which are mounted on the circuit of the voltage-controlled oscillator. Also, the strip-line 16 for constituting a resonator is formed on this surrounded portion. A ground conductor located opposite to this strip-line is formed within the stacked board, or on a rear surface of this surrounded portion.

A trimming point 32 is formed between a center tap 19 of the strip-line 16 and a hot terminal 18. A portion of this trimming point 32 is projected from the strip-line to a side portion. Another trimming point 33 is formed over a substantially entire length of the strip-line between the center tap 19 and the shortcircuited end 17. This trimming point 33 is projected to the side of the center tap 19.

In FIG. 1A, when a shift signal having a value of, for example, approximately 3V is applied from the shift signal input terminal 22, the center tap 19 is electrically shortcircuited to the ground in the AC manner, so that the inductance value of the strip-line 16 is decreased and therefore the resonant frequency is increased. The resonant frequency can be greatly changed by turning ON/OFF this shift signal.

In FIG. 1A and FIG. 2B, symbols "A1", "B1", and "C1" indicate slits as trimming traces used to adjust a shift amount and a frequency. The slit "A1" is formed in the vicinity of the center tap 19 along the strip-line 16, and directed toward the side of the shortcircuited end 17 of this strip-line 16. In the case of this slit A1, when a length of a notch of this slit directed from the side of the center tap 19 to the shortcircuited end 17 is increased, a current path defined from the hot terminal 18 to the center tap 19 is increased under such a condition that the center tap 19 is shortcircuited to the ground. As a result, the inductance value of the strip-line is increased in accordance with the length of the slit A1. As a consequence, when the shift signal is set to ON, a change in the oscillating frequencies with respect to the notch length of the slit A1 is large. On the other hand, when the shift signal is set to OFF, as shown in the drawings, since the slit A1 is formed in the vicinity of the center tap 19, a changing degree of widths of the strip-line 16 in another current path defined from the side of the center tap 19 to the shortcircuited end 17 is decreased. A change in the oscillating frequencies is decreased with respect to a change in the notch lengths of the slit A1. As a result, a shift amount of the oscillating frequencies can be adjusted by adjusting the length of the notched slit A1. The shift amount of the oscillating frequencies is equal to a difference between the oscillating frequencies when the shift signal is set to ON/OFF states.

The slit C1 by the trimming is formed at the trimming point 32 between the center tap 19 and the hot terminal 18 in a direction along which the strip-line is intersected by this slit from an edge located opposite to a projection portion of this strip-line toward the side direction. As indicated in FIG. 1D, the larger the length of the slit C1 by the trimming is extended, the larger the inductance value is increased. As a result, the oscillating frequency is lowered. It should be noted that the longer the length of the slit C1 is extended, the slightly smaller the shift amount becomes.

In the case that the oscillating frequency is adjusted in this voltage-controlled oscillator, the strip-line 16 is set in such a manner that the oscillating frequency oscillated when the shift signal is set to OFF becomes higher than a target value, and also the shift amount when the shift signal is set to OFF becomes higher than a target value. Then, first of all, while the oscillating frequency is monitored under such a condition that the shift signal is set to the OFF state, the trimming of the slit C1 is carried out until the oscillating frequency reaches the target value. Subsequently, while monitoring a difference between the oscillating frequency produced when the shift signal is set to the OFF state, and the oscillating frequency produced when the shift signal, is set to the ON state, namely monitoring a shift amount, the slit A1 is conducted. When the shift amount reaches the target value, the trimming of the slit A1 is stopped.

It should be noted that the adjustment of this oscillating frequency, namely the adjustment of the shift amount may be alternatively achieved. Contrary to the above-described manner, the shift amount may be first adjusted by the slit A1, and thereafter the slit C1 may be conducted. Furthermore, in order to adjust a shift in the oscillating frequency caused by forming the slit C1, after the slit C1 has been conducted, the slit A1 may be furthermore conducted so as to perform a fine adjustment. Alternatively, the adjustment may be carried out in this order of the slit C1 trimming, the slit A1 trimming and the slit C1 trimming.

On the other hand, the above-described slit B1 is formed in the vicinity of the shortcircuited end 17 of the strip-line 16 along this strip-line 16 in the direction of the center tap 19. Since the width of the strip-line 16 becomes narrow, an inductance value is increased in accordance with the length of the slit B1. As a consequence, as indicated in FIG. 1C, the oscillating frequency produced when the shift signal is set to the OFF state is lowered. Also, as shown in FIG. 1C, when the shift signal is set to the ON state, the center tap 19 is electrically shortcircuited in the AC manner. Thus, there is a small influence in the oscillating frequency, cased by the slit B1. As a consequence, the shift amount can be increased in accordance with the length of the slit B1.

In the case that shift amount is adjusted by employing this slit B1, while the shift amount is set to be smaller than a target value, the length of the slit B1 is gradually extended until the shift amount reaches this target value by monitoring the shift amount. In this case, there is a small change in the oscillating frequencies by the trimming of the slit B1 when the shift signal is set to the ON state. As a consequence, the adjustment of the oscillating frequency by the trimming of the slit C1 is carried out under such a condition that the shift signal is set to the ON state. In other words, the adjustment of the slit oscillating frequency, namely the adjustment of the shift amount is preferably carried out by any one of the below-mentioned fine adjustments, i.e., the slit C1 trimming to the slit B1 trimming under ON state of the shift signal, and the shift amount adjustment achieved by the slit C1 trimming to the slit B1 trimming, and thereafter the fine adjustment by the slit C1 trimming.

With employment such an adjustment, both the shift amount and the oscillating frequency can be precisely adjusted. Also, since only one resonator made of the stripline is employed, it is possible to avoid a large-scaled voltage-controlled oscillator.

Second Embodiment

Figure 3A:
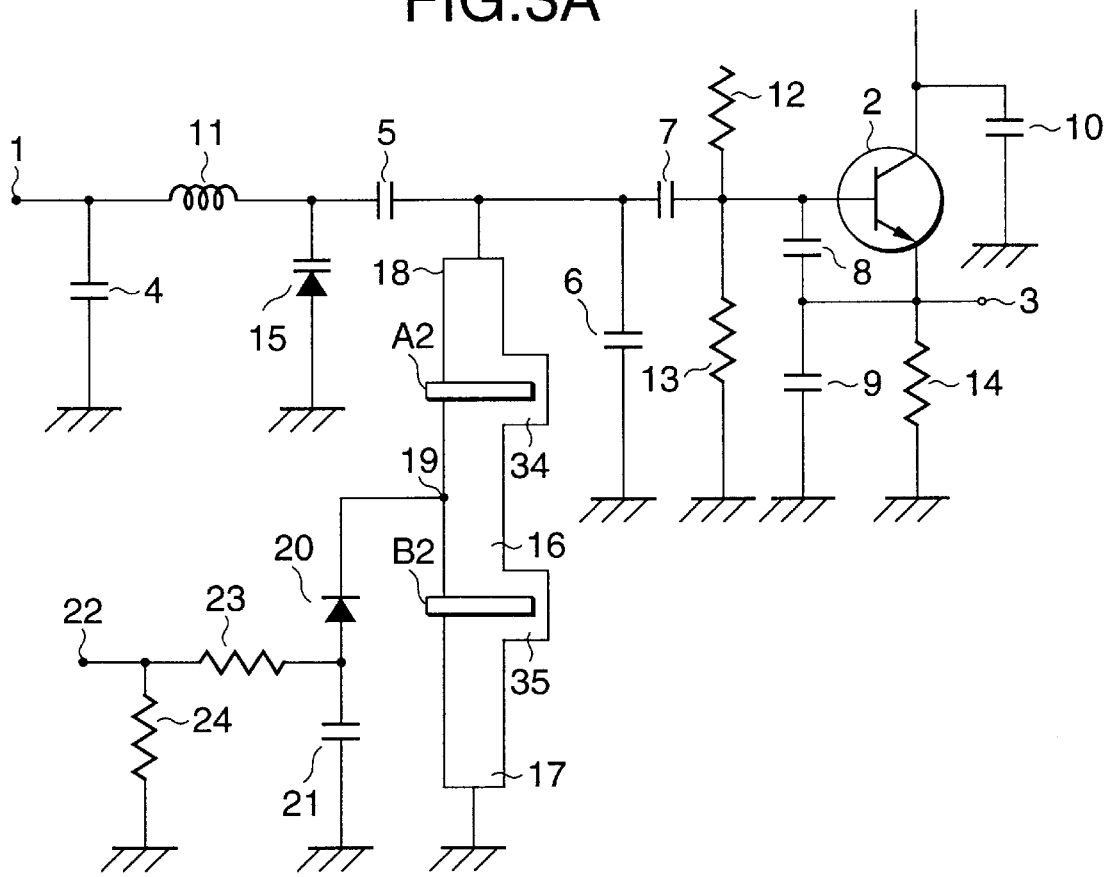
FIG. 3A is a circuit diagram of a voltage-controlled oscillator for showing a frequency shift amount adjusting method of the voltage-controlled oscillator according to another embodiment mode of the present invention.
Figure 3B:
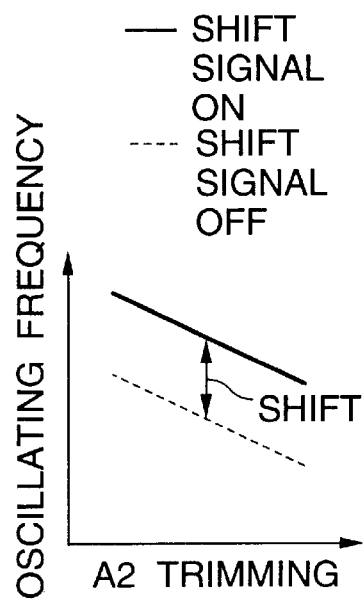
FIGS. 3B and 3C are diagrams for representing a relationship between trimmings, oscillating frequencies, and shift amounts of this voltage-controlled oscillator.
Figure 3C:
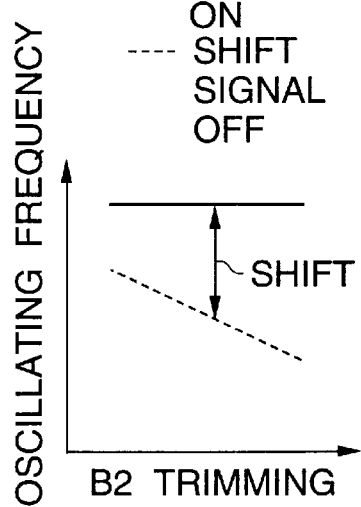

FIG. 3A is a circuit diagram of a voltage-controlled oscillator according to another embodiment of the present invention, and a trimming method thereof. FIG. 3B and FIG. 3C represent trimming amounts and adjustment amounts of shift amounts. In the embodiment of FIG. 3A, a trimming point 34 is formed on the side of the hot terminal 18 of the strip-line 16 from the center tap 19. Another triming point 35 is formed on the side of the shortcircuited end 17 from the center tap 19. These trimming points 34 and 35 are made by projecting portions of the strip-line 16 toward the side direction. A slit A2 and another slit B2 are formed in at least one of these trimming points 34 and 35 in a direction along which these slits A2 and B2 intersect the stripline 16.

As indicated in FIG. 3B, a relationship between the slit A2 and the shift amount at the trimming point 34 formed on the side of the hot terminal 18 is given as follows. The longer the length of the slit A2 is extended, the slightly smaller the shift amount becomes. However, a change amount is small. On the other hand, as indicated in FIG. 3C, an oscillation frequency is lowered when the shift signal is set to the OFF state in accordance with the length of the slit B2 of the trimming point 35 on the side of the shortcircuited end 17. When the shift signal is set to the ON state, the center tap 19 is shortcircuited to the ground. As a result, the length of the trimming gives no influence to the oscillating frequency. As a consequence, the slit A2 is trimmed while the shift signal is set to the ON state. Thereafter, the shift amount is preferably adjusted by trimming the slit B2.

Alternatively, when the present invention is executed, a transistor may be employed to shortcircuit the center tap 18 instead of the above-described diode 20 and capacitor 21.

In accordance with the present invention, the center tap is formed on the strip-line. The inductance value of this strip-line may be greatly made different from each other by shortcircuiting this center tap to the ground, or not by shortcircuiting the center tap to the ground. The voltage-controlled oscillator can be used in the two largely changed frequency bands. Furthermore, the shift amount of the oscillating frequency can be adjusted by trimming the slit from the center tap of the strip-line to the shortcircuited end by trimming the slit from the shortcircuited end to the center tap, otherwise by trimming the slit in the direction along which the stripline is intersected by the slit from the center tap to the hot terminal side, or from the center tap to the shortcircuited end. The shift amount can be precisely adjusted. Also, since only one resonator is employed, it is possible to avoid the large-scaled voltage-controlled oscillator.

What is claimed is:

1. A voltage-controlled oscillator comprising:
   a strip-line used as a resonator;
   a center tap provided in the strip-line of said resonator; a switching element connected to said center tap; and
   at least one slit formed in said strip-line to change an inductance thereof,
   wherein said center tap is electrically shortcircuited to a ground by turning ON said switching element so as to vary an oscillating frequency and said at least one slit comprises a first slit formed along the strip-line located in vicinity of said center tap and directed to a short-circuited end side of the strip-line to thereby adjust an amount of a frequency shift.

2. The voltage-controlled oscillator as claimed in claim 1, wherein the at least one slit further comprises a second slit formed in a transverse direction of said strip-line.

3. The voltage-controlled oscillator as claimed in claim 2, wherein the at least one slit further comprises a third slit formed along the strip-line located in the vicinity of a shortcircuited end side of the strip-line and directed to said center tap to thereby adjust an amount of a frequency shift.

4. A voltage-controlled oscillator comprising:
   a strip-line used as a resonator;
   a center tap provided in the strip-line of said resonator
   a switching element connected to said center tap; and
   at least one slit formed in said strip-line to change an inductance thereof,
   wherein said center tap is electrically shortcircuited to a ground by turning ON said switching element so as to vary an oscillating frequency and the at least one slit comprises a first slit formed along the strip-line located in the vicinity of a shortcircuited end side of the strip-line and directed to said center tap to thereby adjust an amount of a frequency shift.

5. The voltage-controlled oscillator as claimed in claim 4, wherein the at least one slit further comprises a second slit formed in a transverse direction of said strip-line.

6. A voltage-controlled oscillator comprising:
   a strip-line used as a resonator;
   a center tap provided in the strip-line of said resonator;
   a switching element connected to said center tap; and
   a slit formed in said strip-line above said center tap to change an inductance thereof, wherein said center tap is electrically shortcircuited to a ground by turning ON said switching element so as to vary an oscillating frequency and the slit formed in a transverse direction of said strip line and configured, upon trimming, to decrease said operating frequency without substantially changing an amount of frequency shift.

7. A voltage-controlled oscillator comprising:

a strip-line used as a resonator;

a center tap provided in the strip-line of said resonator;

a switching element connected to said center tap; and at least one slit formed in said strip-line to change an inductance thereof, wherein said center tap is electrically shortcircuited to a ground by turning ON said switching element so as to vary an oscillating frequency and trimming points are defined on a side of a hot terminal of said strip-line from said center tap and on a side of a short-circuited end of said strip from said center tap; and the at least one slit is formed in at least any one of said trimming points in a transverse direction of said strip line.

8. The voltage-controlled oscillator as claimed in claim 7, wherein another slit is formed at another trimming point in a transverse direction of the strip-line.

9. In a voltage-controlled oscillator having a structure that a strip-line is employed as a resonator, a center tap is provided in the strip-line of said resonator, a switching element is connected to said center tap, and said center tap is electrically shortcircuited to the ground by turning ON said switching element so as to vary an oscillating frequency, a method for adjusting a frequency shift amount of the voltage-controlled oscillator comprises a step of:

forming at least one slit in the strip-line to change an inductance of the strip-line to thereby adjust an amount of a frequency shift, wherein said at least one slit comprises a first slit formed along the strip-line located in vicinity of said center tap and directed to a shortcircuited end side of the strip-line to thereby adjust said amount of said frequency shift.

10. The method as claimed in claim 9, wherein the at least one slit further comprises a second slit formed in a transverse direction of said strip-line.

11. The method as claimed in claim 10, wherein the at least one slit further comprises a third slit formed along the strip-line located in the vicinity of a shortcircuited end side of the strip-line and directed to said center tap to thereby adjust an amount of a frequency shift.

12. In a voltage-controlled oscillator having a structure that a strip-line is employed as a resonator, a center tap is provided in the strip-line of said resonator, a switching element is connected to said center tap, and said center tap is electrically shortcircuited to the ground by turning ON said switching element so as to vary an oscillating frequency, a method for adjusting a frequency shift amount of the voltage-controlled oscillator comprises a step of:

forming at least one slit in the strip-line to change an inductance of the strip-line to thereby adjust an amount of a frequency shift, wherein the at least one slit comprises a first slit formed along the strip-line located in the vicinity of a shortcircuited end side of the strip-line and directed to said center tap to thereby adjust an amount of a frequency shift.

13. The method as claimed in claim 12, wherein the at least one slit further comprises a second slit formed in a transverse direction of said strip-line.

14. In a voltage-controlled oscillator having a structure that a strip-line is employed as a resonator, a center tap is provided in the strip-line of said resonator, a switching element is connected to said center tap, and said center tap is electrically shortcircuited to the ground by turning ON said switching element so as to vary an oscillating frequency, a method for adjusting a frequency shift amount of the voltage-controlled oscillator comprises a step of:

forming a slit in the strip-line above said center tap to change an inductance of the strip-line to thereby adjust an amount of a frequency shift, wherein the slit is formed in a transverse direction of said strip-line and configured, upon trimming, to decrease said operating frequency without substantially changing an amount of frequency shift.

15. In a voltage-controlled oscillator having a structure that a strip-line is employed as a resonator, a center tap is provided in the strip-line of said resonator, a switching element is connected to said center tap, and said center tap is electrically shortcircuited to the ground by turning ON said switching element so as to vary an oscillating frequency, a method for adjusting a frequency shift amount of the voltage-controlled oscillator comprises a step of:

forming at least one slit in the strip-line to change an inductance of the strip-line to thereby adjust an amount of a frequency shift, wherein trimming points are defined on a side of a hot terminal of said strip-line from said center tap and on a side of a short-circuited end of said strip from said center tap; and the at least one slit is formed in at least any one of said trimming points in a transverse direction of said strip line.

16. The method as claimed in claim 15, wherein another slit is formed at another trimming point in a transverse direction of the strip-line.

* * * * *